(12) United States Patent
Hsieh et al.

(10) Patent No.: US 10,644,209 B2
(45) Date of Patent: May 5, 2020

(54) LIGHT-EMITTING DEVICE AND LIGHT-EMITTING APPARATUS COMPRISING THE SAME

(71) Applicant: EPISTAR CORPORATION, Hsinchu (TW)

(72) Inventors: Min-Hsun Hsieh, Hsinchu (TW); Jai-Tai Kuo, Hsinchu (TW); Wei-Kang Cheng, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/240,362

(22) Filed: Jan. 4, 2019

(65) Prior Publication Data
US 2019/0157529 A1    May 23, 2019

Related U.S. Application Data

(63) Continuation of application No. 15/165,943, filed on May 26, 2016, now abandoned.

(51) Int. Cl.
| | |
|---|---|
| *H01L 33/60* | (2010.01) |
| *H01L 25/075* | (2006.01) |
| *H01L 33/48* | (2010.01) |
| *H01L 33/50* | (2010.01) |
| *H01L 33/62* | (2010.01) |
| *H01L 33/58* | (2010.01) |

(52) U.S. Cl.
CPC .......... *H01L 33/60* (2013.01); *H01L 25/0753* (2013.01); *H01L 33/486* (2013.01); *H01L 33/502* (2013.01); *H01L 33/62* (2013.01); *H01L 33/58* (2013.01); *H01L 2933/0091* (2013.01)

(58) Field of Classification Search
None
See application file for complete search history.

(56) References Cited

U.S. PATENT DOCUMENTS

| | | | |
|---|---|---|---|
| 2005/0064154 A1 | 3/2005 | Aylward et al. | |
| 2007/0284600 A1* | 12/2007 | Shchekin | H01L 33/46 257/98 |
| 2011/0220927 A1* | 9/2011 | Min | H01L 25/167 257/91 |
| 2014/0077236 A1 | 3/2014 | Yamada | |
| 2014/0362565 A1 | 12/2014 | Yao et al. | |
| 2015/0129919 A1* | 5/2015 | Liu | H01L 24/19 257/98 |
| 2015/0369988 A1 | 12/2015 | Hsu et al. | |

* cited by examiner

*Primary Examiner* — Steven B Gauthier
(74) *Attorney, Agent, or Firm* — Patterson + Sheridan, LLP

(57) ABSTRACT

The present application discloses a light-emitting device comprising a light-emitting unit and a flexible carrier supporting the light-emitting unit. The light-emitting unit comprises a LED chip, a first reflective layer on the LED chip and an optical diffusion layer formed between the first reflective layer and the LED chip.

12 Claims, 13 Drawing Sheets

1000D

1000D

LIGHT-EMITTING DEVICE AND LIGHT-EMITTING APPARATUS COMPRISING THE SAME

REFERENCE TO RELATED APPLICATION

This application is a continuation application of U.S. patent application Ser. No. 15/165,943, filed on May 26, 2016 entitled "LIGHT-EMITTING DEVICE AND LIGHT EMITTING APPARATUS COMPRISING THE SAME", which is incorporated by reference in its entirety.

BACKGROUND

Technical Field

The present disclosure relates to a light-emitting device having multiple LED units formed on a substrate and a light-emitting apparatus comprising a light-emitting device.

Description of the Related Art

Light-emitting diode (LED) is more sustainable, longevous, light and handy, and less power consuming, and therefore it is considered as a new light source for illumination. LED applies to various applications like the traffic signal, backlight module, street light, and medical instruments, and becomes a major lighting source. When LED applies to indoor lighting, efforts are required to reduce the dimension, such as thickness, and the increase of the light field of LED.

SUMMARY

One aspect of the present application discloses a light-emitting device comprising a light-emitting unit and a flexible carrier supporting the light-emitting unit. The light-emitting unit comprises a LED chip, a first reflective layer on the LED chip and an optical diffusion layer formed between the first reflective layer and the LED chip.

Another aspect of the present application discloses a light-emitting apparatus comprising a frame, a flexible carrier and a light-emitting unit on the flexible carrier. The flexible carrier has a first end and a second end connected to the frame. The light-emitting unit comprises a LED chip, a reflective layer between the LED chip and the frame and an optical diffusion layer formed on the LED chip.

Another aspect of the present application discloses a light-emitting apparatus comprising a light guide, a light-emitting unit, a cover formed on the light-emitting unit and a flexible carrier connected to the light-emitting unit. The light guide has a top surface, a bottom surface opposite to the top surface and a lateral surface connecting the top surface and the bottom surface. The light-emitting unit comprises a LED chip, a reflective layer on the LED chip, and an optical diffusion layer formed between the reflective layer and the LED chip. The cover is connected to the light guide.

BRIEF DESCRIPTION OF DRAWINGS

FIG. 3A-2 shows a lateral view of the series of light-emitting devices of FIG. 3A-1.

DETAILED DESCRIPTION OF THE PREFERRED EMBODIMENTS

Figure 1A:
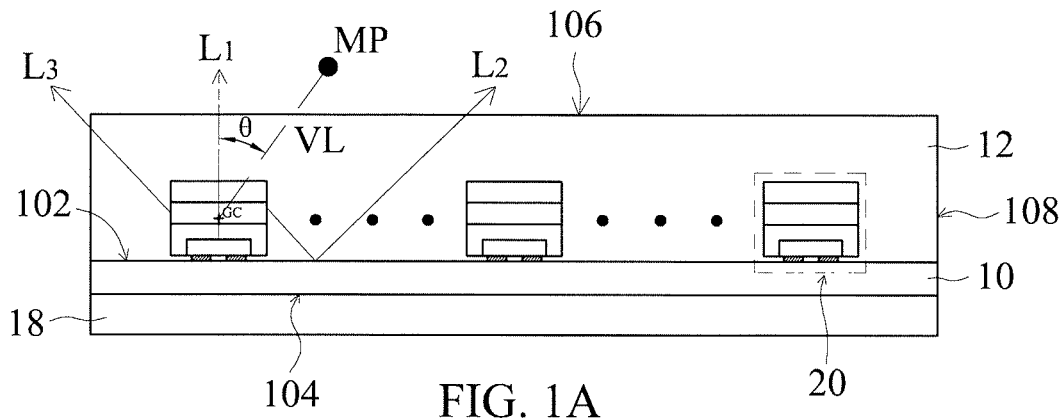
FIG. 1A shows a first embodiment of a light-emitting device in accordance with this disclosure.

Reference is made in detail to the preferred embodiments of the present disclosure, examples of which are illustrated in the accompanying drawings. Wherever possible, the same reference numbers are used in the drawings and the description to refer to the same or like parts.

It will be apparent to those having ordinary skill in the art that various modifications and variations can be made to the devices in accordance with the present disclosure without departing from the scope or spirit of the disclosure. It is intended that the present disclosure covers modifications and variations of this disclosure provided they fall within the scope of the following claims and their equivalents.

FIG. 1A shows a first embodiment of a light-emitting device 1000 in accordance with this disclosure. The light-emitting device 1000 has an upper surface 106, a side surface 108, multiple light-emitting units 20 formed on a first surface 102 of a carrier 10, an adhesive layer 18 formed on the second surface 104, and a cover 12 covering the multiple light-emitting units 20 and the carrier 10. The top-view shape of the light-emitting device 1000 can be elongated, such as a rectangular shape with a ratio of a length to a width of the light-emitting device 1000 greater than 1.1, for example, a size of 300 mm*400 mm. The multiple light-emitting units 20 are separated from each other on the carrier 10. To be more specific, a distance between two light-emitting units 20 is less than 10 mm, and preferably, the distance is between 3 mm and 10 mm. The light-emitting units 20 are arranged in a 2-dimensional array. The thickness of the light-emitting device 1000 except the adhesive layer 18 is less than 7 mm. Preferably, the thickness of the light-emitting device except the adhesive layer 18 is between 1 mm and 7 mm. The light-emitting device 1000 can be used as a planar light-emitting device, such as a troffer or a backlight source of an LCD display. The multiple light-emitting units 20 are electrically connected to each other by a wiring pattern on the first surface 102. The wiring pattern is further electrically connected to an external power source. In another embodiment, the wiring pattern is formed on the second surface 104 and connected to the first surface 102 of the carrier through metal plugs penetrating the carrier 10 to electrically connect to the multiple light-emitting units 20 on the first surface 102. In an embodiment, the cover 12 and the carrier 10 are both flexible such that the light-emitting device 1000 is flexible. The adhesive layer 18 has an adhesive outer surface for easily attaching the light-emitting device 1000 to other parts. In another embodiment, the adhesive layer 18 can be omitted from the light-emitting device 1000. It is noted that the light-emitting device 1000 includes light-emitting units 20 which can be replaced by the light-emitting unit disclosed in the following embodiments in accordance with the present disclosure.

Referring to FIG. 1A, a normal line L1 denotes a line normal to a top surface of one light-emitting unit 20 passes through the geometric center GC of the light-emitting unit 20. The light emitted from the light-emitting device 1000 travels in various directions. For example, the light beam L2 travels in a direction from the carrier 10 to the cover 12 and passes the upper surface 106, and the light beam L3 travels in a direction from the carrier 10 to the cover 12 and passes the side surface 108.

When measuring the optical property, such as light-emitting efficiency, color temperature, CRI, illumination uniformity, unified glare rating (UGR) or light intensity, of the light-emitting device 1000 at a measuring point MP, an offset angle θ is formed between the normal line L1 and a virtual line VL connecting the geometric center GC of the light-emitting unit 20 to the measuring point MP. The illumination uniformity of the light-emitting device is measured at a specific measuring point MP having an offset angle θ is defined by dividing an average light intensity with the maximum light intensity measured at an area with respect to the measuring point MP. The measuring area locates at a virtual plane being parallel to the first surface 102 of the carrier. That is, the normal line L1 is perpendicular to the first surface 102 and the virtual plane where the measuring area locates. Moreover, the "measuring point" represents the geometric central point of the measuring area, and the maximum light intensity and the average light intensity respectively represent the maximum value and the average value of the light intensity within the measuring area. The light-emitting device 1000 has a light-emitting efficiency larger than 80 lm/W while emitting white light of a color temperature between 3000K and 8000K. For example, the light-emitting device 1000 has a light-emitting efficiency about 136 lm/W with a color temperature of 3000K. The CRI of the light-emitting device 1000 is larger than 80. The UGR of the light-emitting device 1000 is larger than 19. The illumination uniformity of the light-emitting device 1000 measured at the measuring point MP having an offset angle θ between 0° and 90° is larger than or equal to 80%. For example, the illumination uniformity measured at a measuring point MP with an offset angle θ of 30° is larger than 85.1%. The area is larger than 1 mm2 and less than 250000 mm2. Preferably, the area is between 10000 mm2 and 240000 mm2. Besides the light-emitting device 1000 has an illumination uniformity larger than 91.2% at the measuring point having an offset angle θ of 0°, larger than 82.5% at the measuring point having an offset angle θ of 60° and larger than 80.1% at the measuring point having an offset angle θ of 90°. It is noted, the measuring point having an offset angle θ of 0° locates directly above the cover 12 and can be passed by the normal line L1. Generally, the illumination uniformity measured at a measuring point with an offset angle θ between 30° and 90° is larger than 80%.

Figure 1B:
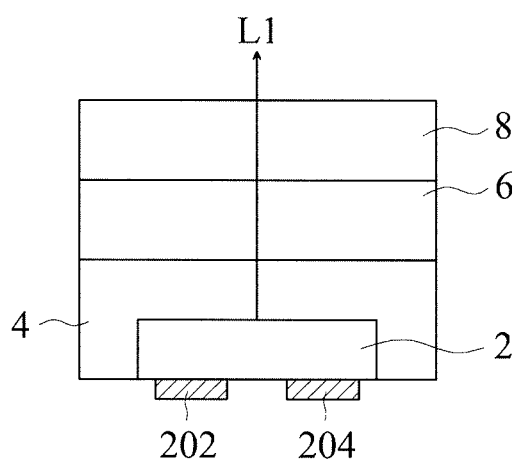
FIG. 1B shows a first embodiment of a light-emitting unit included in a light-emitting device in accordance with this disclosure.
Figure 1C:
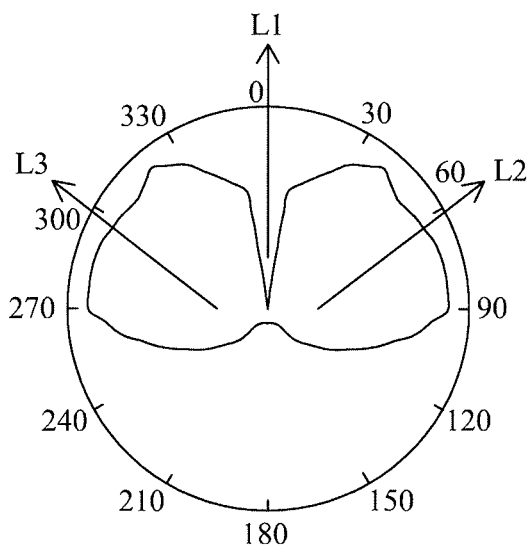
FIG. 1C shows a light field pattern of the light-emitting unit of FIG. 1B.

FIG. 1B shows a first embodiment of a light-emitting unit included in a light-emitting device in accordance with this disclosure. The light-emitting unit 20 has an LED chip 2, a wavelength conversion layer 4, an optical diffusion layer 6 and a reflective layer 8 sequentially stacked on the top surface of the LED chip 2. The wavelength conversion layer 4 covers a top surface and a lateral surface of the LED chip 2 without covering the bottom surface of the LED chip 2. The wavelength conversion layer 4 is directly connected to the LED chip 2. The optical diffusion layer 6 is formed on the wavelength conversion layer 4 and covers only the top surface of the LED chip 2. The reflective layer 8 is formed on the optical diffusion layer 6 and covers only the top surface of the LED chip 2. The optical diffusion layer 6 and the reflective layer 8 are not directly connected to the LED chip 2. The side surfaces of the wavelength conversion layer 4, the optical diffusion layer 6 and the reflective layer 8 are substantially coplanar with each other. In other words, the side surfaces of the wavelength conversion layer 4, the optical diffusion layer 6 and the reflective layer 8 form the side surfaces of the light-emitting unit 20. In another embodiment, the light-emitting unit 20 has two or more LED chips 2, such as a blue LED chip and a red LED chip or two blue LED chips. The light-emitting unit 20 has a first bonding pad 202 and a second bonding pad 204 on the bottom surface, and connected to the LED chip 2. Light emitted from the LED chip 2 are reflected by the reflective layer 8 toward the lateral surface of the light-emitting unit 20. FIG. 1C shows a light field pattern of the light-emitting unit 20 of FIG. 1B. To be more specific, the light intensity around the top region of the light-emitting unit 20, e.g. between 30 and 330 degree in FIG. 1C, is lower than that around the lateral region of the light-emitting unit 20, e.g. 270~330 degree or 30~90 degree in FIG. 1C. The light intensity around the lateral region is at least 10% higher than that around the top region of the light-emitting unit 20. The light-emitting unit 20 disclosed herein can be applied to and included in the light-emitting device or the light-emitting apparatus disclosed in the foregoing or following embodiments in accordance with the present disclosure.

Figure 1D:
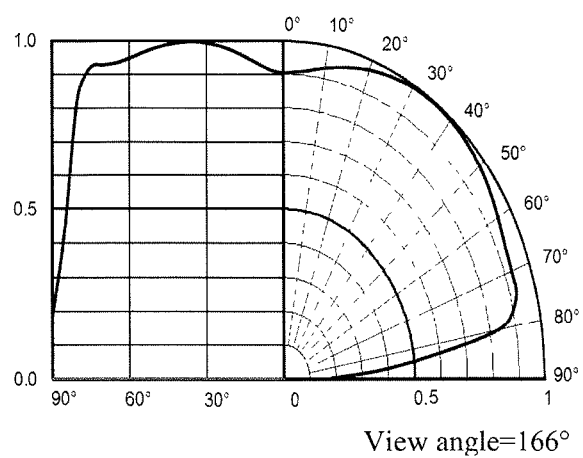
FIG. 1D shows a luminous intensity distribution curve of the light-emitting unit of FIG. 1B.

FIG. 1D shows a luminous intensity distribution curve of the light-emitting unit 20 of FIG. 1B. Referring to FIG. 1D, the view angle of the light-emitting unit 20 is about 166°. Preferably, the light-emitting unit is designed to have a view angle larger than 140°. The view angle represents a widest range confined by two boundary angles each having a light intensity at least 50% of the maximum light intensity among the emitting spectrum of the light-emitting unit 20. For example, when the light-emitting unit 20 has light intensities at the angle of 10° and 210° both greater than or equal to 50% of the maximum light intensity, the light-emitting unit 20 has the two boundary angles of being 10° and 210° and has a view angle of being 200°. The LED chip 2 comprises a semiconductor stack with an active layer for emitting an incoherent light, such as a red light, a blue light, or a green light depending on the material of the active layer. The wavelength conversion layer 4 on the LED chip 2 has one or more phosphor materials, and the one or more phosphor materials are stimulated by a first light beam from the LED chip 2 and emit a second light beam with a color different from that of the first light beam. The one or more phosphor materials include, but not limited to, yellow-greenish phosphor or red phosphor. The yellow-greenish phosphor includes aluminum oxide (such as YAG or TAG), silicate, vanadate, alkaline-earth metal selenide, or metal nitride. The red phosphor includes silicate, vanadate, alkaline-earth metal sulfide, oxynitride, fluoride ($K_2TiF_6:Mn^{4+}$, $K_2SiF_6$: $Mn^{4+}$), or a mixture of tungstate and molybdate.

The LED chip 2 has a first conductivity-type semiconductor layer, a second conductivity-type semiconductor layer, and an active layer between the first conductivity-type semiconductor layer and the second conductivity-type semiconductor layer. The first conductivity-type semiconductor layer and the second conductivity-type semiconductor layer each perform as a cladding layer or a confinement layer for respectively providing electrons and holes to be combined in the active layer and emit light accordingly. The first conductivity-type semiconductor layer, the active layer, and the second conductivity-type semiconductor layer include group III-V semiconductor material, such as $Al_xIn_yGa_{(1-x-y)}N$ or $Al_xIn_yGa_{(1-x-y)}P$, wherein $0 \leq x$, $y \leq 1$; $(x+y) \leq 1$. Based on the material of the active layer, the LED chip 2 can emit a red light with a peak wavelength between 610 nm and 650 nm, a green light with a peak wavelength between 530 nm and 570 nm, or a blue light with a peak wavelength between 450 nm and 490 nm.

The optical diffusion layer 6 and the cover 12 are transparent to the light emitted from the LED chip 2. The composition of the optical diffusion layer 6 is similar to that of the cover 12. The optical layer 6 or the cover 12 has a transparency larger than 60% and includes a matrix. The matrix comprises a material having refractive index of 1.4~1.6, such as polymer or oxide. The polymer includes silicone, epoxy, PI, BCB, PFOB, SU8, acrylic resin, PMMA, PET, PC, polyetherimide, or fluorocarbon. The oxide includes $Al_2O_3$, SINR, SU8, or SOG. In another embodiment, the optical layer 6 or the cover 12 further comprises a plurality of refractive particles (not shown) dispersed in the matrix. The refractive particles have a refractive index higher than that of the matrix, such as titanium dioxide, silicon dioxide, aluminum oxide, zinc oxide, or zirconium dioxide. The bonding pad 202 and the second bonding pad 204 include metal or metal alloy, such as Cu, Ti, Au, Ni or combinations thereof.

The reflective layer 8 can be a DBR (Distributed Bragg Reflector) layer or a metal reflective layer. In another embodiment, the optical diffusion layer 6 can be omitted from the light-emitting unit 20, and the reflective layer 8 directly contacts the wavelength conversion layer 4.

The carrier 10 can be flexible and is transparent to the light emitted from the light-emitting element 20. For example, the carrier 10 has a transparency larger than 90% corresponded to a light from the LED chip 2. Preferably, the transparency of the carrier is larger than 92% with respect to a light having a peak wavelength of 550 nm. The carrier can be formed of PET, PI(polyimide), HPVDF(hyper-polyvinylidene fluoride), or ETFE (ethylene-tetrafluoro ethylene). Preferably, the carrier has a transparency between 92%~100% with respect to the light from the light-emitting unit, and the carrier is fully cured at a curing temperature between 160° C.~200° C. to resist diverse environment during operation. Preferably, the carrier 10 has a transparency larger than 90% and a glass transition temperature larger than 160° C. In one embodiment, the carrier 10 is formed of HPVDF and particles having a particle size around 1~100 nm for adjusting the transparency of the carrier. Preferably, the particle size of one particle is less than 50 nm.

Figure 1E:
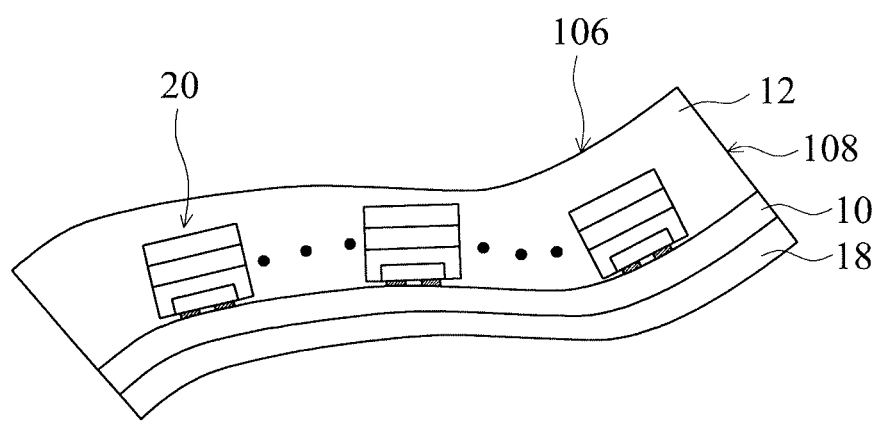
FIG. 1E shows a schematic view of the light-emitting device of FIG. 1A in a bent situation.

FIG. 1E shows a schematic view of the light-emitting device 1000 of FIG. 1A in a bent situation. The carrier 10 is flexible, and the surface of the carrier 10 can be bent to be a curve having various concaves and protrusions (such as having different sizes, radius or depth) as shown in FIG. 1E. Moreover, the surfaces of the carrier 10 and the adhesive layer 18 parallel to the upper surface 106 are bent to be a curved surface. Though the carrier 10 is bent, the light-emitting units 20 are tightly connected to the carrier 10 by having the cover 12 tightly connecting to the carrier. Moreover, the optical property, such as light-emitting efficiency, color temperature, CRI, illumination uniformity, unified glare rating (UGR) or light intensity, measured from the bent light-emitting device 1000 in FIG. 1E are similar to those measured from the unbent light-emitting device in FIG. 1A. That is, the variation of the optical properties are not perceptive whether the light-emitting device 1000 is bent or not, therefore the light-emitting device 1000 can be applied to specific applications, such as high resolution display, medical surgery and wearable device.

Figure 2A:
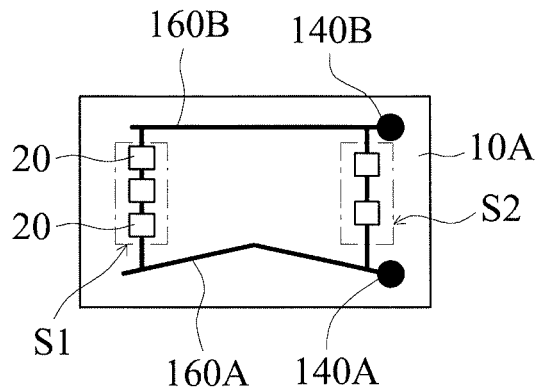
FIG. 2A shows a top view of a first example of the light-emitting device of FIG. 1A.

FIG. 2A shows a top view of a first example of the light-emitting device 1000 of FIG. 1A. Referring to FIG. 2A, the difference between the light-emitting device 1000 of FIG. 1A and the light-emitting device 1000A of the present embodiment is that the light-emitting device 1000A further comprises a first wiring pattern 160A, a second wiring pattern 160B, a first string S1 having three light-emitting units 20 connected in series and a second string S2 having two light-emitting units 20 connected in series on the carrier 10A, a first metal pad 140A on the carrier 10A, and a second metal pad 140B on the carrier 10A wherein each of the first metal pad 140A and the second metal pad 140B has a metal plug penetrating the carrier 10A. The light-emitting units 20 and the wiring patterns 160A and 160B are covered by the cover 12 as shown in FIG. 1A while the metal pads 140A and 140B are not covered by the cover 12. The first wiring pattern 160A is directly connected to the first metal pad 140A and the second wiring pattern 160B is directly connected to a second metal pad 140B. The arrangement of first wiring pattern 160A is different from that of the second wiring pattern 160B, such as the layout and their positions in the light-emitting device 1000A. In another embodiment, the first wiring pattern 160A has a spring shape or a wave shape to improve the mechanical strength and prevent the wiring patterns from being broken when the light-emitting device is bent. The first string S1 and the second string S2 are electrically connected in parallel.

Figure 2B:
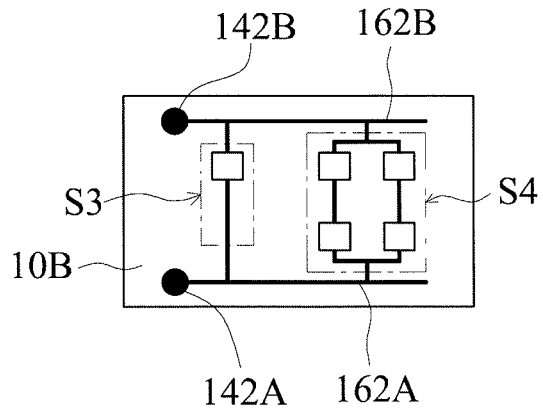
FIG. 2B shows a top view of a second example of the light-emitting device of FIG. 1A.

FIG. 2B shows a top view of a second example of the light-emitting device 1000 of FIG. 1A. Referring to FIG. 2B, the difference between the light-emitting device 1000 of FIG. 1A and the light-emitting device 1000B of the present embodiment is that the light-emitting device 1000B further comprises a third wiring pattern 162A, a fourth wiring pattern 162B, a first string S3 having one light-emitting units 20 and a fourth string S4 having four light-emitting units 20 electrically connected in parallel on the carrier 10B, a third metal pad 142A on the carrier 10B, and a fourth metal pad 142B on the carrier 10B wherein each of the third metal pad 142A and the fourth metal pad 142B has a metal plug penetrating the carrier 10B. The light-emitting units 20 and the wiring patterns 162A and 162B are covered by the cover 12 as shown in FIG. 1A while the metal pads 142A and 142B are not covered by the cover 12. The third wiring pattern 162A is directly connected to the third metal pad 142A and the fourth wiring pattern 162B is directly connected to the fourth metal pad 142B. The light-emitting units 20 in the strings S1-S4 are electrically connected in parallel or in series depending on the application thereto. Similarly, the connections between the strings S1-S4 in light-emitting device 1000A or in light-emitting device 1000B can be modified for different applications.

Figure 2C:
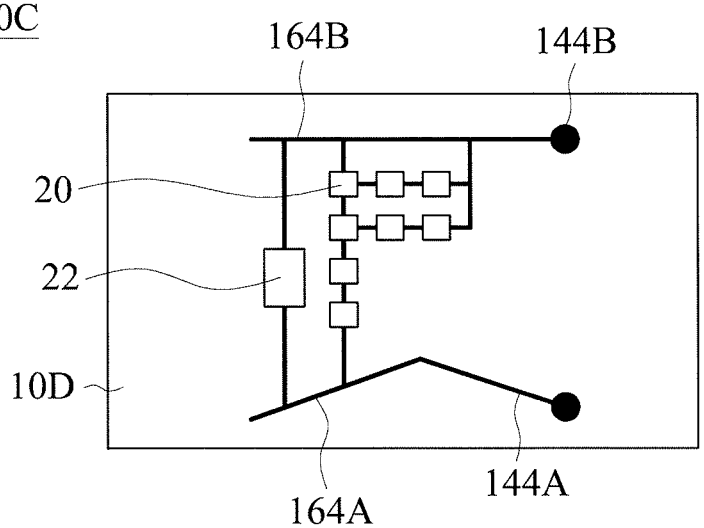
FIG. 2C shows a top view of a third example of the light-emitting device of FIG. 1A.
Figure 2D:
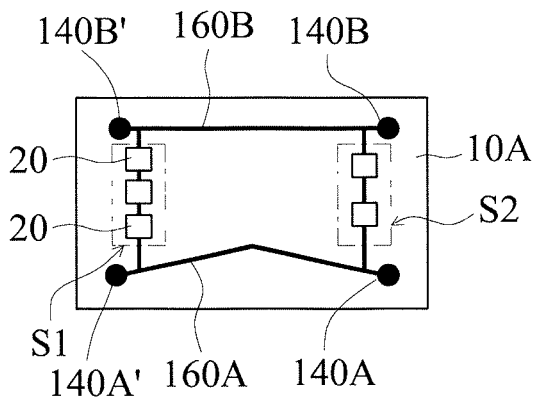
FIG. 2D shows a top view of a fourth example of the light-emitting device of FIG. 1A.

FIG. 2C shows a top view of a third example of the light-emitting device 1000 of FIG. 1A. The difference between the light-emitting device 1000 of FIG. 1A and the light-emitting device 1000C of the present embodiment is that the light-emitting device 1000C further comprises an electrical power source 22, a first wiring pattern 164A, a second wiring pattern 164B formed on the top surface of the carrier 10D, a fifth metal pad 144A on the carrier 10D, and a sixth metal pad 144B on the carrier 10D wherein each of the fifth metal pad 144A and the sixth metal pad 146B has a metal plug penetrating the carrier 10D. The light-emitting units 20 and the wiring patterns 164A and 164B are covered by the cover 12 as shown in FIG. 1A while the metal pads 144A and 144B and the power source 22 are not covered by the cover 12. The electrical power source 22 is electrically connected to the light-emitting units 20 and the wiring patterns 164A and 164B. The light-emitting device 1000C further includes other electrical elements (not shown in the figure), such as capacitor, inductor or resistor etc. for protecting or rectifying purpose. The electrical power source 22 can be a battery or a photovoltaic cell to provide electrical power. In another embodiment, the wiring pattern can be formed on top and bottom surfaces of the carrier such that the light-emitting units 20 are only formed on one side of the carrier 10D and the electrical elements are only formed on the other side of the carrier 10D. FIG. 2D shows a top view of a fourth example of the light-emitting device 1000 of FIG. 1A. The light-emitting device 1000A' in FIG. 2D has a similar structure compared with the light-emitting device 1000A in FIG. 2A. The difference is that the light-emitting device 1000A' further comprises a seventh metal pad 140A' formed on the opposite end of the first wiring pattern 160A with respect to the first metal pad 140A and an eighth metal pad 140B' formed on the opposite end of the second wiring pattern 160B with respect to the second metal pad 140B. Therefore, one metal pad (e.g. metal pad 140B) is used to connect to another light-emitting device (e.g. light-emitting device 1000B) and the other metal pad (e.g. metal pad 140B') is used to connect to another light-emitting device. That is, one light-emitting device can be connected to another light-emitting device in both ends such that light-emitting devices can be connected in series to a desired number of the serially-connected light-emitting devices. Furthermore, the connection type on one end of the wiring pattern, such as connection on the first metal pad 140A, can be different from the connection type on the other end of the same wiring pattern, such as connection on the seventh metal pad 140A'.

Figures 1, 3A:
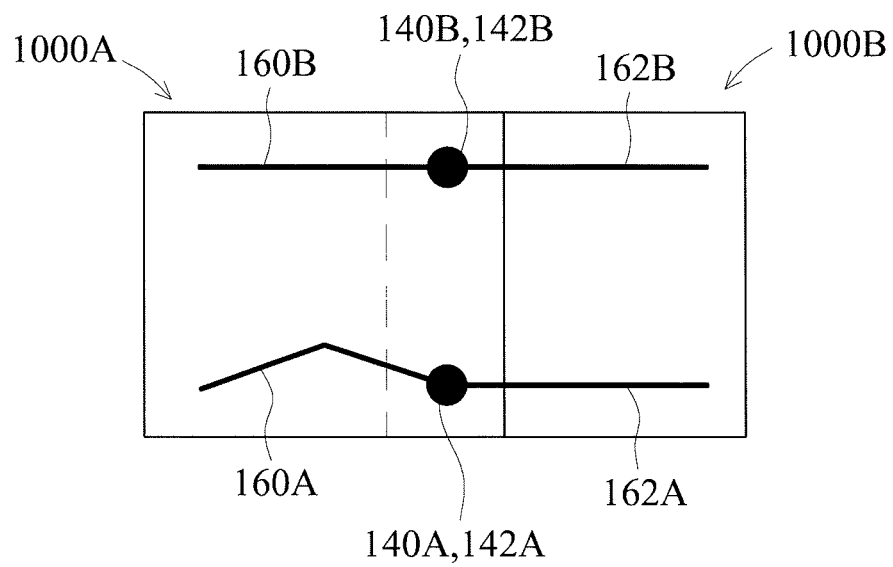
FIG. 3A-1 shows a top view of a first embodiment of a series of light-emitting devices in accordance with this disclosure.
Figures 2, 3A:
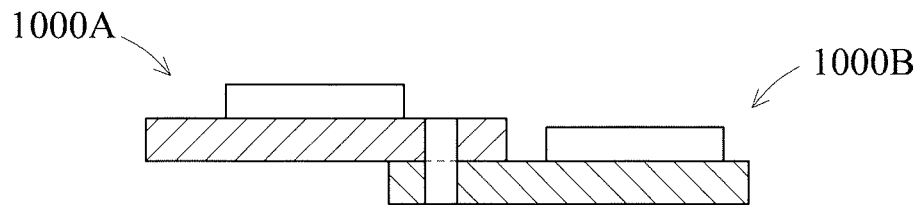

FIG. 3A-1 shows a top view of a first embodiment of a series of light-emitting devices in accordance with this disclosure. Referring to FIG. 3A-1, a series of light-emitting devices 1000D is formed by connecting multiple light-emitting devices selected from the light-emitting devices 1000A, 1000B, and 1000C. For example, the light-emitting device 1000D comprises the light-emitting device 1000A of FIG. 2A-1 and the light-emitting device 1000B of FIG. 2A-2 connected to each other through metal pads. In another embodiment, metal pads are added at two opposite ends of the wiring patterns so the light-emitting device can be connected in both sides. Referring to FIG. 3A-1, the third wiring pattern 162A is electrically connected to the first wiring pattern 160A by bonding the first metal pad 140A to the third metal pad 142A. Likely, the fourth wiring pattern 162B is electrically connected to the second wiring pattern 160B by bonding the second metal pad 140B to the fourth metal pad 142B. FIG. 3A-2 shows a lateral view of the light-emitting device of FIG. 3A-1. The first metal pad 140A is bonded to the third metal pad 142A and the light-emitting device 1000A has a portion being overlapped with a portion of the light-emitting device 1000B.

Figure 3B:
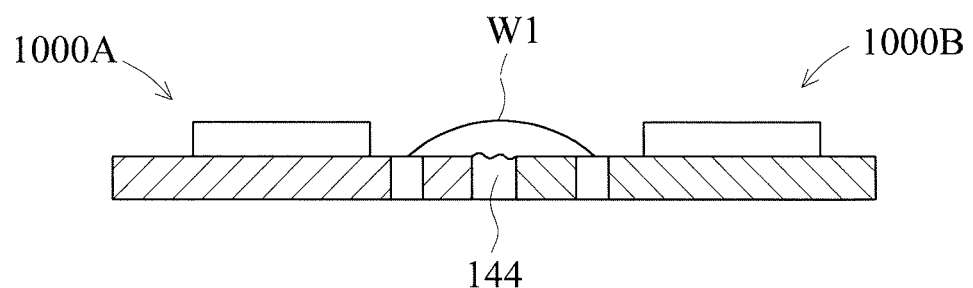
FIG. 3B shows a lateral view of a second embodiment of a series of light-emitting devices in accordance with this disclosure.

FIG. 3B shows a lateral view of a second embodiment of a series of light-emitting devices in accordance with this disclosure. The series of light-emitting devices 1000D in FIG. 3B is formed by connecting multiple light-emitting devices selected from the light-emitting devices 1000A, 1000B, and 1000C. For example, the light-emitting device 1000D comprises the light-emitting device 1000A of FIG. 2A-1 and the light-emitting device 1000B of FIG. 2A-2 connected to each other through an adhesive layer 144 and a wire W1. The wire W1 physically and electrically connects the metal pad 140A to the metal pad 142A.

Figure 3C:
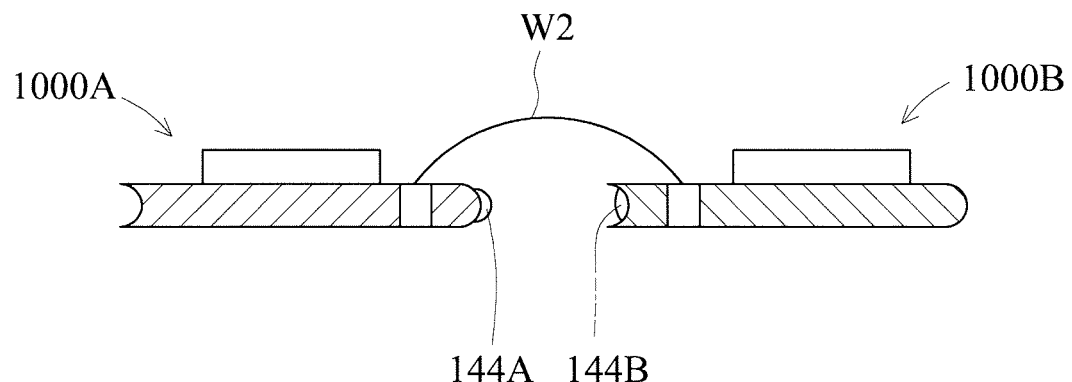
FIG. 3C shows a lateral view of a third embodiment of a series of light-emitting devices in accordance with this disclosure.

FIG. 3C shows a lateral view of a third embodiment of a series of light-emitting devices in accordance with this disclosure. The series of light-emitting devices 1000D in FIG. 3B is formed by connecting multiple light-emitting devices selected from the light-emitting devices 1000A, 1000B, and 1000C. For example, the light-emitting device 1000D comprises the light-emitting device 1000A of FIG. 2A-1 and the light-emitting device 1000B of FIG. 2A-2 connected to each other through an adhesive layers 144A and 144B and a wire W2. The wire W2 connects the metal pad 140A and the metal pad 142A. The adhesive layer 144, or 144A and 144B are formed between lateral surfaces of the light-emitting device 1000A and the light-emitting device 1000B as shown in FIG. 3B and FIG. 3C. The lateral surface can be a flat surface as shown in FIG. 3B or a curved surface as shown in FIG. 3C wherein the curved surfaces on two sides of one light-emitting device are complementary to each other. In another embodiment, the wire, such as the wire W1 or W2, and the wiring patterns, such as the wiring pattern 160A, 160B, 162A and 162B are all formed on the bottom side of a light-emitting device which is opposite to the top side of the light-emitting device where the cover 12 locates. In another embodiment, the adhesive layer 18 can be included in one or more light-emitting devices in the embodiments shown in FIGS. 3A-1, 3B and 3C.

In an embodiment, multiple light-emitting devices are connected with each other in a shape, such as a curve, a circle or a rectangle from a top view for specific purpose. The light-emitting units 20 in a light-emitting device can be arranged in various shapes for different application, such as showing specific picture, pattern or word. In another embodiment, the light-emitting device is bended, and has a radius of curvature not more than 25 cm. The connection between light-emitting devices disclosed herein can be applied to and included in the light-emitting device in the foregoing or following embodiments in accordance with the present disclosure.

Figure 4A:
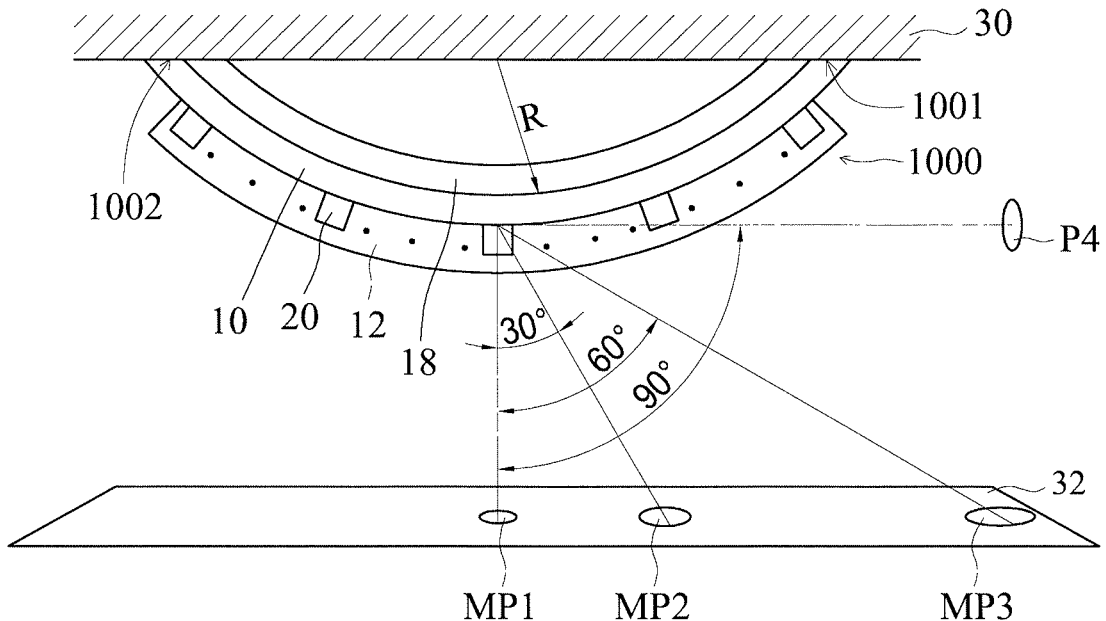
FIG. 4A shows a second embodiment of a light-emitting device in accordance with this disclosure.

FIG. 4A shows a second embodiment of a light-emitting device in accordance with this disclosure. Referring to FIG. 4A, the light-emitting device 1000 of FIG. 1A is connected to an attaching plane 30, such as a surface of a wall. The detail of the light-emitting device 1000 can be referred to FIG. 1A and the description thereof, and is omitted for brevity. The first end 1001 and the second end 1002 of the light-emitting device 1000 are connected to the attaching plane 30 so a gap is formed between the light-emitting device 1000 and the surface of the attaching plane 30. The light-emitting device 1000 is bent to form a curvature. The gap is an air gap. The attaching plane 30 can be a surface of a wall or a ceiling. In another embodiment, the adhesive layer 18 can be omitted from the light-emitting device 1000.

Figure 4B:
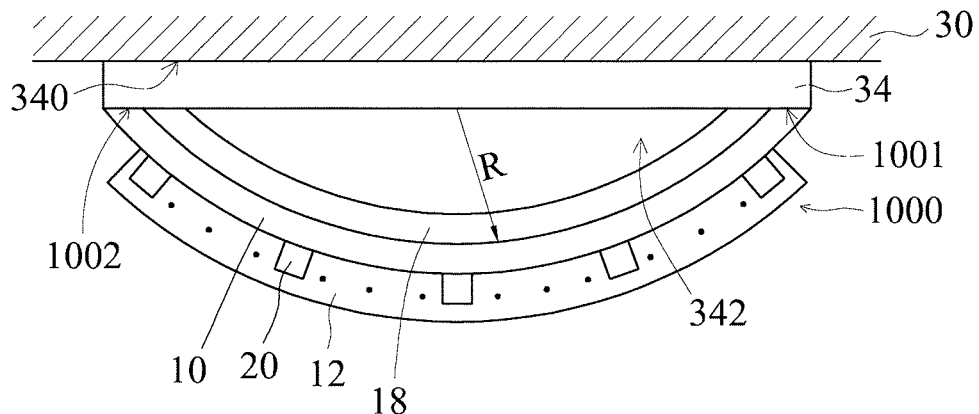
FIG. 4B shows a first embodiment of a light-emitting apparatus having the light-emitting device of FIG. 4A.

FIG. 4B shows a first embodiment of a light-emitting apparatus having the light-emitting device 1000 of FIG. 1A. Referring to FIG. 4B, the light-emitting apparatus 2000 includes a light-emitting device 1000 and a frame 34, wherein the light-emitting device 1000 has a first end 1001 and a second end 1002 connected to the frame 34 to form a curvature R. The frame 34 has an inner surface 342 close to the light-emitting device 1000 and an outer surface 340 opposite to the inner surface. The outer surface 340 of the frame 34 can be sticky or has an adhesive layer formed thereon for practical use. The frame 34 can be further attached to the ceiling with the light-emitting device 1000 protruding out of the ceiling. Similarly, a gap is formed between the light-emitting device 1000 and the frame 34. In another embodiment, the light-emitting apparatus 2000 is embedded in a cavity formed in the ceiling or the wall such that a part of the light-emitting device 1000 is surrounded by a side wall of the cavity. In another embodiment, a reflective layer having a reflectivity more than 80% to the light emitted from the light-emitting units 20 is formed on the inner surface 342 of the frame. In another embodiment, the adhesive layer 18 can be omitted from the light-emitting device 1000.

Referring to FIG. 4A, the illumination uniformity of the light-emitting device 1000 is measured at different angles. The method of measuring the illumination of uniformity of the light-emitting device 1000 is well defined in the foregoing embodiments. The first measuring point MP1 is directly under the light-emitting device 1000, wherein an offset angle θ of the first measuring point MP1 is 0°. The offset angle θ of the measuring point MP2 is 30° and the offset angle θ of the measuring point MP2 is 60°. The measuring points MP1~MP3 locates on the surface 32. The offset angle θ of the measuring point MP4 is 90°. The illumination uniformity is 91.2% at the first measuring point MP1, 85.2% at the second measuring point MP2, 82.5% at the third measuring point MP3, and 80.1% at the fourth measuring point MP4 while the radius of curvature R of the light-emitting device 1000 is substantially 32 mm. It is noted that the illumination uniformity at one measuring point with an offset angle between 30° and 90° is larger than 80% while the radius of curvature R is larger than 25 mm. Besides, the radius of curvature is infinite while the light-emitting device 1000 is unbent. It is noted that the light-emitting device 1000 has a similar illumination uniformity (e.g. difference less than 10%) measured at measuring point with same offset angle compared with the light-emitting apparatus 2000.

Figure 5A:
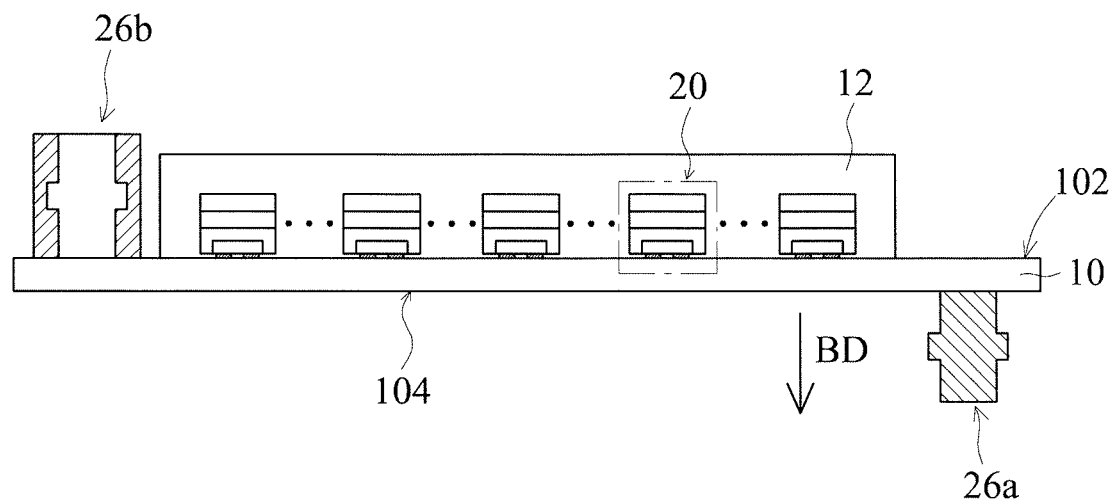
FIG. 5A shows a third embodiment of a light-emitting device in accordance with this disclosure.
Figure 5B:
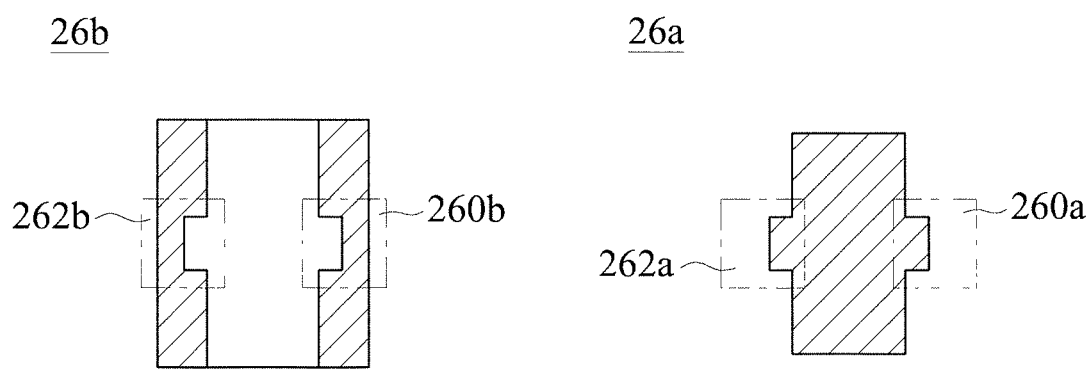
FIG. 5B shows the connectors of FIG. 5A.

FIG. 5A shows a third embodiment of a light-emitting device in accordance with this disclosure. Similar to the light-emitting device 1000 depicted in FIG. 1A, the light-emitting device 1000E has multiple light-emitting units 20 formed on a carrier 10, a cover 12 on the light-emitting units 20. The difference between the light-emitting device 1000 of FIG. 1A and the light-emitting device 1000E of the present embodiment is that the light-emitting device 1000E further comprises a male connector 26a on the second surface 104 of the carrier 10 and a female connector 26b on the first surface 102 of the carrier 10. The connectors 26a and 26b are formed on two ends of the carrier 10 and being separated from the cover 12. The shape of the light-emitting device 1000E can elongated, such as a rectangular for being used as a planar light-emitting device, such as a troffer or a backlight source of an LCD display. Two ends of the carrier 10 can be bent to be a ring by connecting the male connector 26b to the female connector 26a and having the light-emitting units 20 on an outer surface of the carrier 10. The male connector 26a has a first protrusion 260a and a second protrusion 262a being opposite with each other as shown in the right figure of FIG. 5B. The female connector 26b has a first cavity 260b, a second cavity 262b being opposite with each other and an opening between the first cavity 260b and the second cavity 262b as shown in the left figure of FIG. 5B. The male connector 26a can be inserted into the opening of the female connector 26b with respectively connecting the protrusion 260a to the cavity 262b and connecting protrusion 262a to the cavity 260b. The combination of the protrusions and the cavities provides connection with good mechanical strength so two light-emitting devices 1000E can be connected with each other by inserting a male connector 26a of one light-emitting device 1000E into a female connector 26b of another light-emitting device 1000E. In another embodiment, the two light-emitting devices 1000E face with each other and the light-emitting units 20 are formed between two carriers 10. The contour of the cavity of the male connector is complementary to the contour of the corresponding protrusion of the female connector. The contour of the protrusion can be a cylinder, a pillar, or a cone. The cavity and the protrusion can be formed on the same side of the carrier 10, such as on the first surface 102 or the second surface 104, or on the opposite side of the carrier respectively.

Figure 6A:
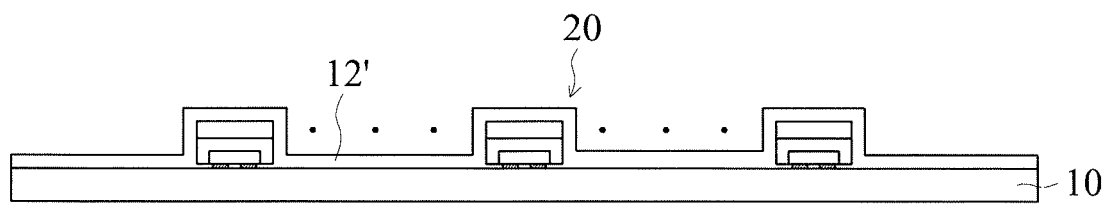
FIG. 6A shows a fourth embodiment of a light-emitting device in accordance with this disclosure.

FIG. 6A shows a fourth embodiment of a light-emitting device 1000F in accordance with this disclosure. Similar to the light-emitting device 1000 depicted in FIG. 1A, the light-emitting device 1000F has multiple light-emitting units 20 formed on a carrier 10 and a cover 12' on the light-emitting units 20. The difference between the light-emitting device 1000 of FIG. 1A and the light-emitting device 1000F of the present embodiment is that the adhesive layer 18 is omitted from the light-emitting device 1000F and the cover 12' is formed on the carrier 10 along the contour of the light-emitting units 20 and the carrier 10 so the compatibility of the contour of the cover 12' matching with the contour of the light-emitting units 20 is better than that of the cover 12' covering the light-emitting units 20 in FIG. 1A. The light-emitting device 1000G can be used as a planar light source, such as a troffer or a backlight source of an LCD display. The cover 12' can be translucent or transparent to light emitted from the light-emitting unit 20. In an embodiment, scattering particles are added in the cover 12' to enhance light scattering effect. In another embodiment, a reflective layer can be formed between the carrier 10 and the light-emitting units 20. Furthermore, an adhesive layer is formed on the surface of the carrier 10 opposite to the surface where the light-emitting unit 20 locates on.

Figure 6B:
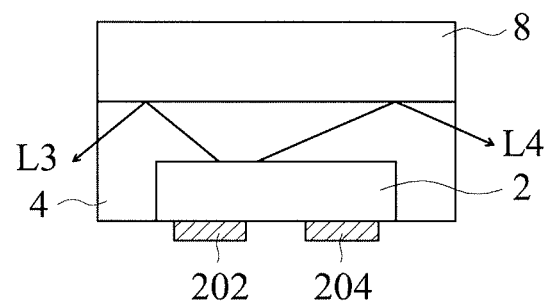
FIG. 6B shows a second embodiment of a light-emitting unit included in a light-emitting device in accordance with the disclosure.

FIG. 6B shows a second embodiment of the light-emitting unit included in a light-emitting device in accordance with the disclosure. The light-emitting unit 20 included in the light-emitting device can be replaced by the light-emitting unit 20' in the foregoing or following embodiments in accordance with the present disclosure. As shown in FIG. 6B, the difference between the light-emitting unit 20 of FIG. 1B and the light-emitting unit 20' of the present embodiment is that the light-emitting unit 20 is devoid of the optical diffusion layer 6 and the reflective layer 8 of the light-emitting unit 20' is directly connected to the wavelength conversion layer 4 so the thickness of the light-emitting unit 20' is less than that of the light-emitting unit 20 for applying to electronic devices requiring ultra-thin dimension. The light-emitting unit 20' has an LED chip 2, a reflective layer 8, a wavelength conversion layer 4 on the top surface of the LED chip 2, and a first bonding pad 202 and a second bonding pad 204 connected to the bottom surface of the LED chip 2. Similarly, the light emitted from the LED chip 2 is reflected by the reflective layer 8 so the light intensity at the top surface of the light-emitting unit 20' is lower than that at the lateral surface of the light-emitting unit 20'. The light-emitting unit 20' has an optical property similar to that of the light-emitting unit 20, such as a view angle greater than 160°. It is noted that the light from the LED chip 2 is not absorbed by the optical diffusion layer so the light-emitting unit 20' has a higher light-emitting intensity compared with that of the light-emitting unit 20. The material of the reflective layer 8, the wavelength conversion layer 4, the pads 202 and 204 in the light-emitting unit 20' is similar to that in the light-emitting unit 20, so the descriptions are omitted for brevity. The light-emitting unit 20' disclosed herein can be applied to and included in the light-emitting device or the light-emitting apparatus disclosed in the foregoing or following embodiments in accordance with the present disclosure.

Figure 7:
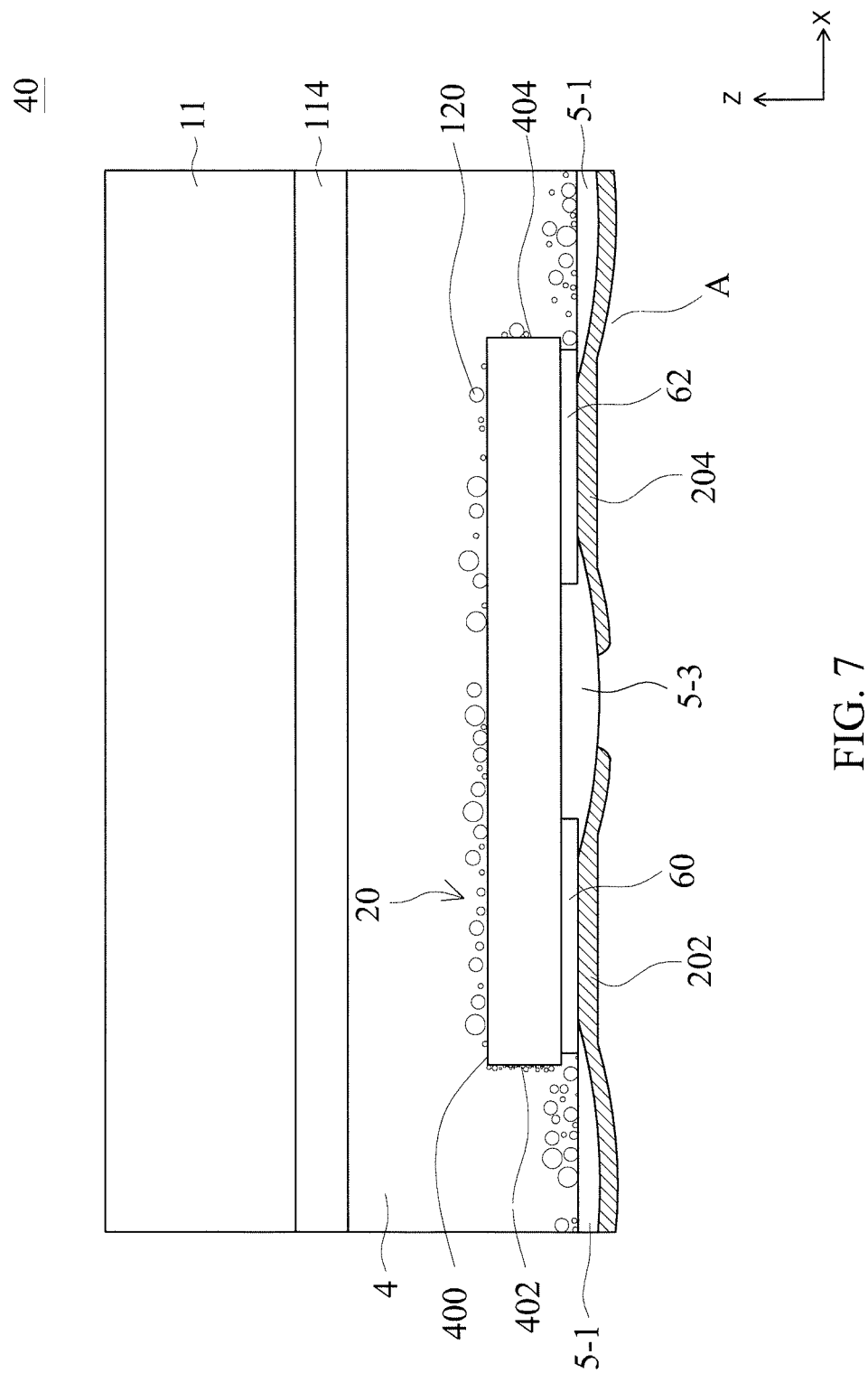
FIG. 7 shows a third embodiment of a light-emitting unit included in a light-emitting device in accordance with this disclosure.

FIG. 7 shows a third embodiment of a light-emitting unit included in a light-emitting device in accordance with this disclosure. Referring to FIG. 7, the light-emitting unit 40 has a LED chip 2d, a wavelength conversion layer 4 composed of wavelength conversion particles 120, insulating layers 5 having insulating portions 5-1 and 5-3, a reflective layer 114, an optical layer 11 and bonding pads 202 and 204. The reflective layer 114 can be a DBR (Distributed Bragg Reflector) layer or a reflective metal layer, and the reflective layer 114 can be formed on the optical layer 11D by coating, attaching or spraying process. The LED chip 2 has an electrode 60 connected to the bonding pad 202 and an electrode 62 connected to the bonding pad 204. The bonding pads 202 and 204 are separated from the electrodes 60 and 62 by the insulating layer 5. The bonding pads 202 and 204 are physically separated from the wavelength conversion layer 4d by the insulating portions 5-1, respectively. The bonding pad 202 has a first portion connected to the insulating portion 5-1 and the electrode 60, and a second portion connected to the insulating portion 5-3. Besides, the first portion has a side surface being coplanar with a side surface of the light-emitting unit 40. The insulating layer 5 has a curved surface connected to the bonding pads 202 and 204, wherein the curved surface is near a side surface of the light-emitting unit 40. Similarly, the insulating layer 5 has a side surface being coplanar with a side surface of the wavelength conversion layer 4. The insulating layer 5 has a non-uniform thickness wherein the largest thickness of the insulating portion 5-3 is larger than the largest thickness of the insulating portion 5-1. The bonding pads 202 and 204 are used to electrically connect to an external power. The wavelength conversion layer 4 is transparent to light emitted from the LED chip 2. The composition of the wavelength conversion layer 4 in FIG. 7 to the same as the wavelength conversion layer 4 in FIG. 1, and the detail description is omitted here for brevity. In the present embodiment, light is capable of emitting through five major emitting surfaces of the light-emitting unit 40 and has a view angle between 100° and 160°. The material of the insulating layer 5 can be oxide, nitride or polymer. The oxide includes silicon oxide (SiOx), titanium oxide (TiOx), tantalum oxide (TaOx), or aluminum oxide (AlOx). The nitride includes aluminum nitride (AlNx) or silicon nitride (SiNx). The polymer includes polymide or benzocyclobutane (BCB). In another embodiment, the insulating layer 5 includes multiple sublayers having alternately stacked low refractive-index layers and high refractive-index layers to form a Distributed Bragg Reflector (DBR). The optical layer 11 includes sapphire, diamond, glass, epoxy, quartz, acrylic resin, SiOx, AlOx, ZnOx, or silicone. In another embodiment, the optical layer 11 can be omitted from the light-emitting unit 40. The LED chip 2 has a top surface 400, and side surfaces 402 and 404. The wavelength converting particles 120 covers the top surface 400, and side surfaces 402 and 404. Furthermore, the wavelength converting particles 120 covers the portion of the insulating layers 5 extending laterally beyond a lateral side of the LED chip 2. The light-emitting unit 40 disclosed herein can be applied to and included in the light-emitting device or the light-emitting apparatus disclosed in the foregoing or following embodiments in accordance with the present disclosure.

Figure 8A:
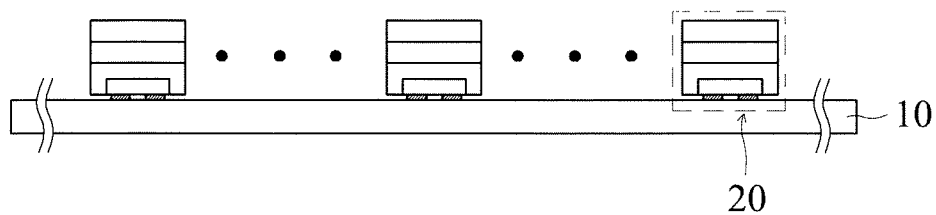
FIGS. 8A-8D show a method of manufacturing a light-emitting device in accordance with this disclosure.
Figure 8B:
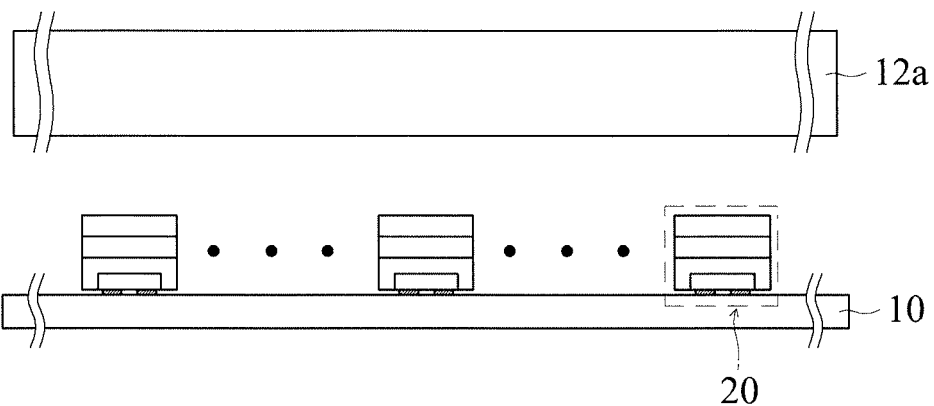
Figure 8C:
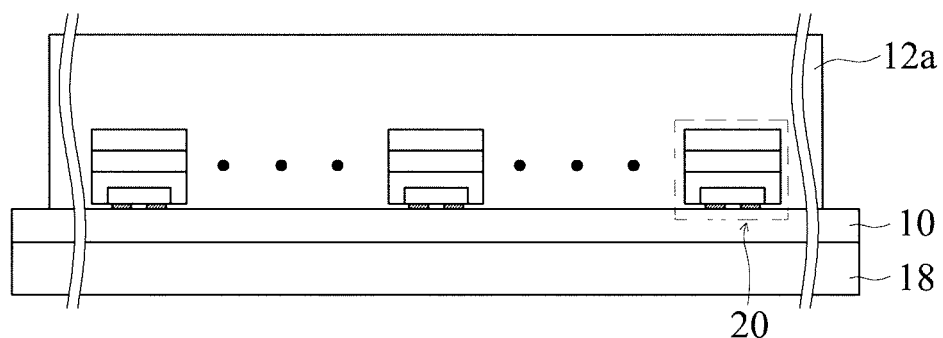
Figure 8D:
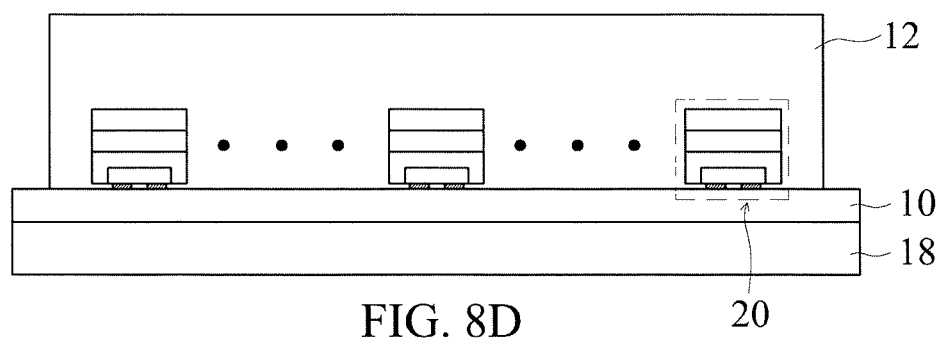
Figure 9A:
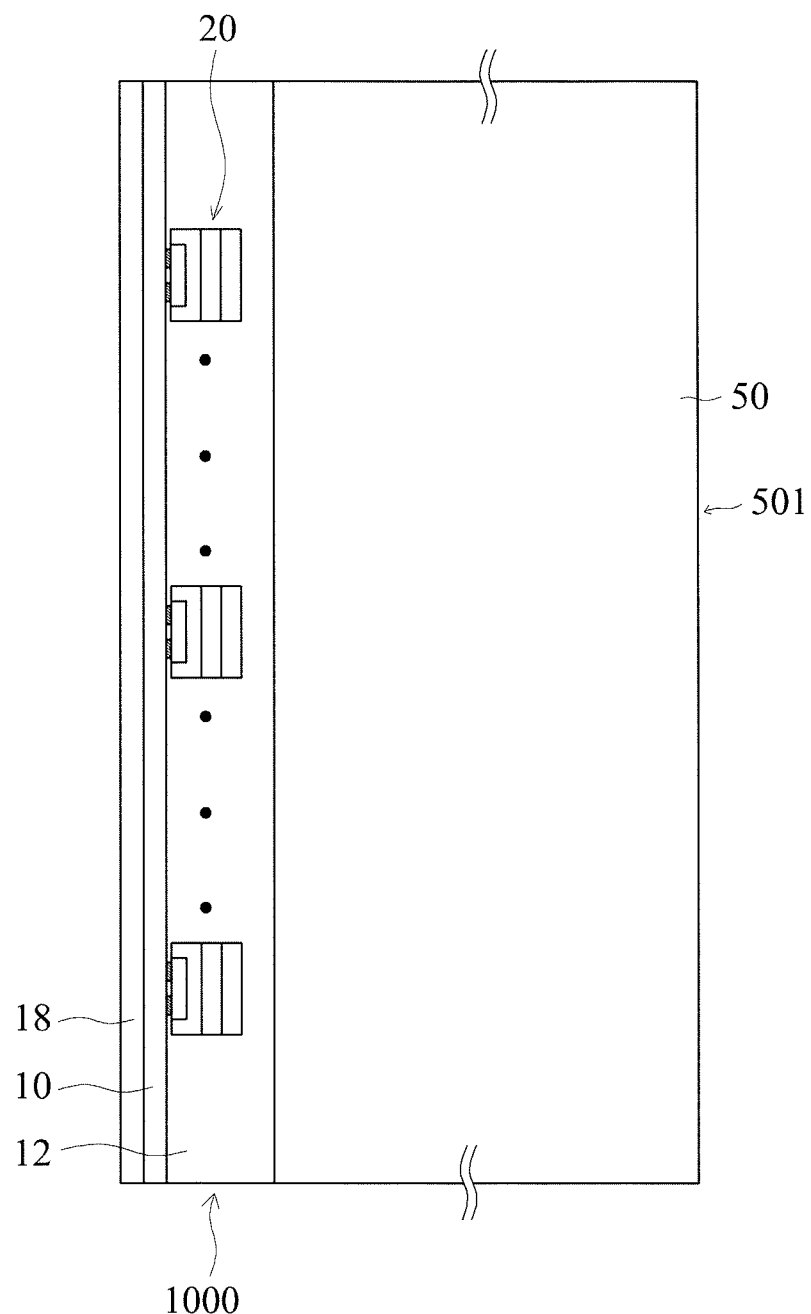
FIG. 9A shows a second embodiment of a light-emitting apparatus having a light-emitting device in accordance with this disclosure.

FIGS. 8A-8D show a method of manufacturing a light-emitting device in accordance with an embodiment of this disclosure. Specifically, FIGS. 8A-8D show a method of manufacturing the light-emitting device 1000 of FIG. 1A. Referring to FIG. 8A, the method comprises a first step of disposing multiple light-emitting units 20 on a top surface of the carrier 10, a second step of providing and forming an uncured cover 12a covering the light-emitting unit 20 as shown in FIG. 8B and FIG. 8C wherein the uncured cover 12a is a sheet with a uniform thickness, a third step of curing the uncured cover 12a to form the cover 12, a fourth step of forming an adhesive layer 18 on a bottom surface opposite to the top surface of the carrier 10 as shown in FIG. 8C, and a fifth step of cutting the structure formed in the fourth step as shown in FIG. 8D, and therefore a light-emitting device 1000 is formed as shown in FIG. 1A. The cover 12 is formed on the light-emitting units 20 with a uniform height from the carrier 10. To be more specific, the curved portion of the cover 12 is removed in the fourth step. In an embodiment, part of the uncured cover 12a is removed to decrease the thickness of the entire structure by method of wet blasting, grinding or lapping. Referring to FIG. 1A, the upper surface 106 is flat on the light-emitting unit 20. Moreover, the method described in FIGS. 8A-8D can be applied to the method for forming the light-emitting device 1000F of FIG. 6A. The difference between the method for forming the light-emitting device 1000 and that for forming the light-emitting device 1000F is that the cover 12 of the light-emitting device 1000 is formed by attaching an uncured cover 12a of a thin film type on the light-emitting units 20 while the cover 12' of the light-emitting device 1000F is formed by conformal coating, e.g. spray coating, a thin layer to cover the light-emitting units 20. The material of cover 12' of the present embodiment has less viscosity compared with that of the uncured cover 12a during manufacturing the light-emitting device. Besides, the thickness of the cover 12 is thicker than the cover 12', but both the thickness of the cover 12 and that of the cover 12' are less than 600 um. Preferably, the thickness of the cover 12 or cover 12' is between 100 um and 500 um. The cover 12 comprises polymer FIG. 9A shows a second embodiment of a light-emitting apparatus having a light-emitting device in accordance with this disclosure. The light-emitting apparatus 2002 has a light guide 50 and a light-emitting device 1000. Referring to FIG. 9A, a light-emitting device 1000 is connected to a side surface of a light guide 50 to form a light-emitting apparatus 2002. The adhesive layer 18 is formed on another side of the light-emitting device 1000 opposite to the side where the light guide 50 is formed. The light-emitting device 1000 can be replaced by any light-emitting device disclosed in the foregoing embodiments in accordance with the present disclosure. The light guide 50 has a light-emitting surface 501. The cover 12 has a uniform thickness measured from an interface between the light guide 50 and the cover 12 to the carrier 10. It is noted that the light-emitting device 1000 includes light-emitting units 20 which can be replaced by the light-emitting unit 20' disclosed in the foregoing embodiments in accordance with the present disclosure. In another embodiment, the adhesive layer 18 can be omitted from the light-emitting device 1000.

Figure 9B:
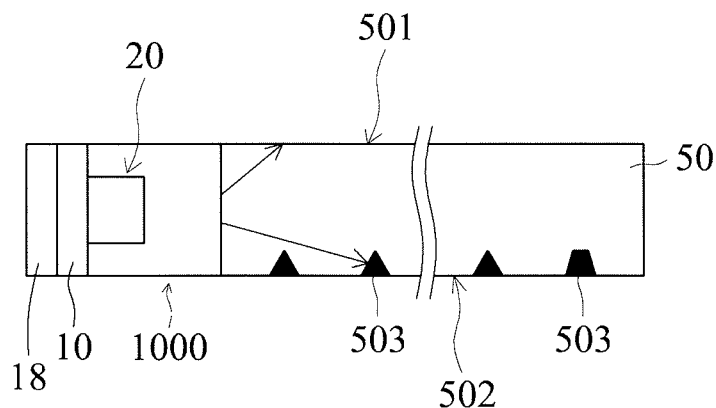
FIG. 9B shows a lateral view of the light-emitting apparatus depicted in FIG. 9A.

FIG. 9B shows a lateral view of the light-emitting apparatus 2002 depicted in FIG. 9A. The light guide 50 has a top surface 501 501, a bottom surface 503, a lateral surface connecting the top surface 501 and the bottom surface 503, and optical structures 503 on the bottom surface 502 opposite to the top surface 501 to redirect, reflect, refract, and/or scatter the light from the light-emitting units 20 toward and through the top surface 501. The lateral surface is connected to the light-emitting device 1000. To be more specific, the cover 12 is connected to the lateral surface. The optical structures 503 embedded in the light guide 50 are configured to distribute light uniformly in the entire light guide 50, and the shape of the optical structure 503 comprises triangle, arc or trapezoid in a cross-sectional view. The structure 503 can be transparent or translucent. The light-emitting apparatus 2002 can be used as a light source, such as a back light module of a display. In another embodiment, the light-emitting device 1000 further comprises a reflective layer formed between the carrier and the cover and between the carrier and the light-emitting unit to enhance light intensity provided by the light-emitting device.

Figure 10A:
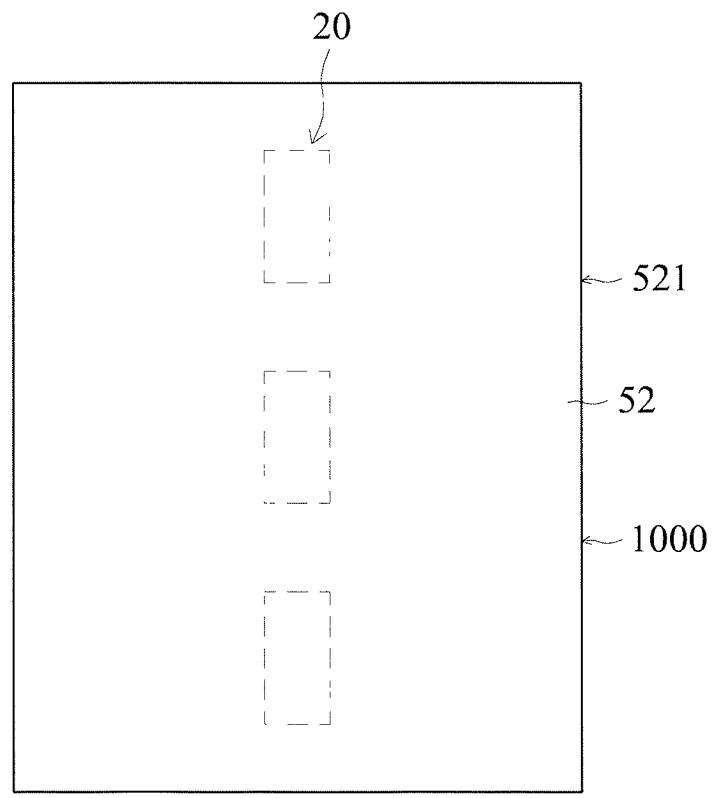
FIG. 10A shows a third embodiment of a light-emitting apparatus having a light-emitting device in accordance with this disclosure.

FIG. 10A shows a third embodiment of a light-emitting apparatus having a light-emitting device in accordance with this disclosure. The light-emitting apparatus 2004 has a light guide 52 and a light-emitting device 1000. The light-emitting device 1000 having multiple light-emitting units 20 is entirely formed under the light-emitting apparatus 2000. It is noted that the positions of the light-emitting units 20 are substantially overlapped with the geometric center line of the light-emitting apparatus 2004. In another aspect, the geometric center of the light guide 50 is overlapped with that of the light-emitting apparatus 2004. That is, the positions of the light-emitting units 20 are substantially overlapped with the geometric center line of the light guide 50. The light-emitting device 1000 can be replaced by any light-emitting device disclosed in the foregoing embodiments in accordance with the present disclosure. The light-emitting units 20 can be replaced by any light-emitting unit disclosed in the foregoing embodiments in accordance with the present disclosure.

Figure 10B:
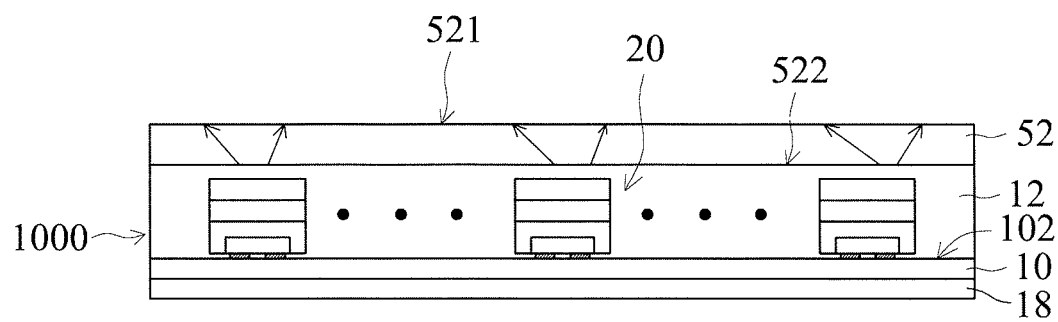
FIG. 10B shows a lateral view of the light-emitting apparatus in FIG. 10A.

FIG. 10B shows a lateral view of the light-emitting apparatus 2004 in FIG. 10A. The adhesive layer 18 is formed on another side of the light-emitting device 1000 opposite to the side where the light guide 52 is formed. The light guide 52 has a top surface 521 and a bottom surface 522 opposite to the top surface 521, wherein light is majorly extracted outside the light-emitting apparatus 2004 through the top surface 521. The light-emitting device 1000 is connected to the bottom surface 522. The light-emitting device 1000 has multiple light-emitting units 20, a carrier 10, and a cover 12. The bottom surface 522 is connected to the light-emitting device 1000. To be more specific, the cover 12 is connected to the bottom surface 522. It is noted that the light-emitting device 1000 in FIGS. 9A-9B provide light majorly from the lateral side of the light guide 50, and the light-emitting device 1000 in FIGS. 10A-10B provide light from the bottom surface 522 of the light guide 52. The top surface 102 of the carrier 10 can be a rough surface to reflect, refract or redirect light, or comprises an optical structure as shown in FIG. 9B. The light guide 52 is used to enhance optical performance, such as uniformity of the light-emitting device 1004. The light-emitting apparatus 2004 can be used as a light source, such as a back light module of a display. In another embodiment, the light-emitting device 1000 further comprises a reflective layer formed between the carrier and the cover and between the carrier and the light-emitting unit to enhance light intensity provided by the light-emitting device. In another embodiment, the adhesive layer 18 can be omitted from the light-emitting device 1000.

Although the drawings and the illustrations above are corresponding to the specific embodiments individually, the element, the practicing method, the designing principle, and the technical theory can be referred, exchanged, incorporated, collocated, coordinated except they are conflicted, incompatible, or hard to be put into practice together.

Although the present disclosure has been explained above, it is not the limitation of the range, the sequence in practice, the material in practice, or the method in practice. Any modification or decoration for present disclosure is not detached from the spirit and the range of such.

What is claimed is:

1. A light-emitting unit, comprising:
   an LED chip having a first top surface, a first bottom surface, and a first side surface arranged between the first top surface and the first bottom surface;
   a wavelength conversion layer directly formed on the first top surface, and having a second top surface, a second bottom surface substantially coplanar with the first bottom surface, and a second side surface arranged between the second top surface and the second bottom surface;
   an optical diffusion layer directly connected to the wavelength conversion layer, and having a third side surface; and
   a reflective layer directly connected to the optical diffusion layer, and having a fourth side surface;
   wherein the second side surface, the third side surface, and the fourth side surface are flush with each other.

2. The light-emitting unit of claim 1, wherein the second side surface is parallel to the first side surface.

3. The light-emitting unit of claim 1, wherein the wavelength conversion layer fully covers the first side surface.

4. The light-emitting unit of claim 1, wherein the light-emitting unit has a first light intensity in a lateral direction, and a second light intensity in a vertical direction, the second light intensity is lower than the first light intensity by 10% or more.

5. The light-emitting unit of claim 1, wherein the first top surface is parallel to the second top surface.

6. The light-emitting unit of claim 1, wherein the second top surface is parallel to the second bottom surface.

7. The light-emitting unit of claim 1, further comprising a first bonding pad and a second bonding pad arranged on a same side of the first LED chip.

8. A light-emitting device, comprising:
a light-emitting unit of claim 1;
a carrier supporting the light-emitting unit and facing the first bottom surface, and
a cover covering the light-emitting unit.

9. The light-emitting device of claim 8, further comprising a light guide directly connected to the cover.

10. The light-emitting device of claim 9, wherein the light guide has a third top surface, a third bottom surface, and a lateral surface between the third top surface and the third bottom surface.

11. The light-emitting device of claim 10, wherein the light guide has a first optical structure and a second optical structure arranged on the third bottom surface.

12. The light-emitting device of claim 11, wherein the first optical structure and the second optical structure are separated from each other.

* * * * *